United States Patent
Guo

(10) Patent No.: US 11,472,984 B1
(45) Date of Patent: Oct. 18, 2022

(54) METHOD OF ENHANCING THE REMOVAL RATE OF POLYSILICON

(71) Applicant: Rohm and Haas Electronic Materials CMP Holdings, Inc., Newark, DE (US)

(72) Inventor: Yi Guo, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 17/485,595

(22) Filed: Sep. 27, 2021

(51) Int. Cl.
  *C09G 1/02* (2006.01)
  *H01L 21/306* (2006.01)
  *C09K 13/00* (2006.01)

(52) U.S. Cl.
  CPC .............. *C09G 1/02* (2013.01); *C09K 13/00* (2013.01); *H01L 21/30625* (2013.01)

(58) Field of Classification Search
  None
  See application file for complete search history.

(56) References Cited

U.S. PATENT DOCUMENTS

| | | | |
|---|---|---|---|
| 6,533,832 B2 | 3/2003 | Steckenrider et al. | |
| 7,314,578 B2 | 1/2008 | Choi et al. | |
| 8,017,524 B2 | 9/2011 | White et al. | |
| 8,048,809 B2 | 11/2011 | Lee et al. | |
| 8,435,420 B1 | 5/2013 | Guo et al. | |
| 2008/0274618 A1* | 11/2008 | Kraft | H01L 21/3212 |
| | | | 438/693 |
| 2021/0163785 A1* | 6/2021 | Kim | H01L 21/76229 |

* cited by examiner

*Primary Examiner* — Roberts P Culbert
(74) *Attorney, Agent, or Firm* — John J. Piskorski

(57) ABSTRACT

A method of enhancing the removal rate of polysilicon from a substrate includes mixing an acid chemical mechanical polishing slurry containing water, an organic acid and an abrasive with an alkaline solution containing water, an abrasive, a low alkyl amine compound; providing a chemical mechanical polishing pad, having a polishing surface; creating dynamic contact at an interface between the polishing pad and the substrate; and dispensing the mixture of the chemical mechanical polishing slurry and the alkaline solution onto the polishing surface at or near the interface between the polishing pad and the substrate, wherein some of the polysilicon is polished away from the substrate.

8 Claims, No Drawings

METHOD OF ENHANCING THE REMOVAL RATE OF POLYSILICON

FIELD OF THE INVENTION

The present invention is directed to a method of enhancing the removal rate of polysilicon from a substrate. More specifically, the present invention is directed to a method of enhancing the removal rate of polysilicon from a substrate by mixing an acid chemical mechanical polishing slurry containing water, an organic acid and abrasive particles with an alkaline solution containing water, a low alkyl chain amine compound; providing a chemical mechanical polishing pad, having a polishing surface; creating dynamic contact at an interface between the polishing pad and the substrate; and dispensing the mixture of the chemical mechanical polishing slurry and the alkaline solution onto the polishing surface at or near the interface between the polishing pad and the substrate, wherein some of the polysilicon is polished away from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planatization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a specific material.

For example, acidic oxide slurries have been increasingly adapted to advanced technology nodes, such as 28 nm and below. The abrasives present in such slurries possess positive charges via a variety of chemical or additive approaches. Such slurries exhibit superior defectivity and planarization efficiency (PE) performance with much lower point of use (POU) silica weight percent than alkaline counterparts.

Meanwhile, it is highly desirable for customers to remain to one consumable set being versatile for multiple chemical mechanical polishing compositions, including polysilicon chemical mechanical polishing as disclosed in U.S. Pat. No. 8,435,420. The chemical mechanical polishing industry has discovered that polishing polysilicon using acidic oxide slurries showed better PE and less dishing; however, a major drawback is the relatively low polysilicon removal rate. For example, an aqueous slurry containing 1-2 wt % colloidal silica particles with a pH of less than 6 delivers about 1600 Å/min polysilicon removal rate. Recently, there has been a demand in the chemical mechanical polishing industry to boost polysilicon removal rates for thick polysilicon applications with acidic oxide slurries where about 2-3 μm of polysilicon are required to be removed from a substrate.

Therefore, there is a need in the chemical mechanical polishing industry to provide a method of enhancing the removal rate of polysilicon from substrates.

SUMMARY OF THE INVENTION

The present invention is directed to a method of chemical mechanical polishing polysilicon, comprising:

providing a substrate comprising polysilicon;

providing an acid chemical mechanical polishing slurry consisting of:

water;

abrasive particles;

an organic acid;

optionally a compound containing two quaternary ammonium groups;

optionally a biocide; and providing an alkaline solution consisting of:

water;

an amine compound having a formula:

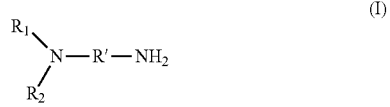

(I)

wherein $R_1$ and $R_2$ are independently chosen from $C_1$-$C_4$ alkyl and R' is $C_1$-$C_4$ alkylene;

optionally a biocide; and mixing the acid chemical mechanical polishing slurry with the alkaline solution to form an alkaline chemical mechanical polishing slurry consisting of the water, the abrasive particles, the organic acid, the amine compound and optionally the biocide; optionally the compound containing two quaternary ammonium groups; and providing a chemical mechanical polishing pad, having a polishing surface;

creating dynamic contact at an interface between the chemical mechanical polishing pad and the substrate; and dispensing the alkaline chemical mechanical polishing slurry onto the polishing surface of the chemical mechanical polishing pad at or near the interface between the chemical mechanical polishing pad and the substrate to remove at least some of the polysilicon.

The present invention is further directed to a method of chemical mechanical polishing polysilicon, comprising:
providing a substrate comprising polysilicon;
providing an acid chemical mechanical polishing slurry consisting of:
water;
abrasive particles;
an organic acid;
optionally a compound containing two quaternary ammonium groups;
optionally a biocide; and
wherein a pH of the acid chemical mechanical polishing slurry is less than 6;
providing an alkaline solution consisting of:
water;
an amine compound selected from the group consisting of 3-(diethylamino)propylamine, N,N-dimethylethylenediamine, N,N-diethylenediamine, N,N-di-n-butylethylenediamine, 3-(dimethylamino)-1-propylamine, N-isopropyl-1,3-dipropanediamine, 2-dimethylamino-2-propylamine and mixtures thereof;
optionally a biocide; and
wherein a pH of the alkaline chemical mechanical polishing solution is greater than 7; and
mixing the acid chemical mechanical polishing slurry with the alkaline solution to form an alkaline chemical mechanical polishing slurry consisting of the water, the abrasive particles, the organic acid, the amine compound, optionally the compound containing two quaternary ammonium groups, optionally the biocide; and
wherein a pH of the alkaline chemical mechanical polishing slurry is greater than 7;
providing a chemical mechanical polishing pad, having a polishing surface;
creating dynamic contact at an interface between the chemical mechanical polishing pad and the substrate; and
dispensing the alkaline chemical mechanical polishing slurry onto the polishing surface of the chemical mechanical polishing pad at or near the interface between the chemical mechanical polishing pad and the substrate to remove at least some of the polysilicon.

The chemical mechanical polishing method of the present invention enables enhanced polysilicon removal rates, reduced static etch rates and provides smooth polished polysilicon surfaces. The method of the present invention also selectively polishes polysilicon over TEOS.

DETAILED DESCRIPTION OF THE INVENTION

As used throughout this specification the following abbreviations have the following meanings, unless the context indicates otherwise: mL=milliliters; μ=μm= microns; kPa=kilopascal; Å=angstroms; DI=deionized; ppm=parts per million=mg/L; 1 wt %=10,000 ppm; mm=millimeters; cm=centimeter; min=minute; rpm=revolutions per minute; lbs=pounds; kg=kilograms; 2.54 cm=1 inch; Poly-Si=polysilicon; DLS=dynamic light scattering; wt %=percent by weight; RR=removal rate; S=slurry; PS=polishing slurry of invention; CS=control slurry; ES=etch solution of the invention; CES=comparative etch solution; POU=point of use; EDA=ethylenediamine; PEI=polyethyleneimine; DRAMS=(N,N-di ethylaminomethyl) triethoxysilane, 98% (Gelest Inc., Morrisville, Pa.); TMOS= tetramethyl orthosilicate; TMAH=tetramethyl ammonium hydroxide; TEA=tetraethyl ammonium; TEAH=tetraethylammonium hydroxide; diquat = N,N,N,N',N'N'-hexabutyl-1,4-butanediammonium dihydroxide; and SiN=silicon nitride.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "slurry" means a mixture of solids denser than water suspended in water. The term "solution" means a mixture where the minor component (solute) is substantially uniformly dissolved in the major component (solvent) wherein the solvent is water. The term "chempack" means an alkaline aqueous solution containing one or more low alkyl amine compounds. The term "polysilicon" means polycrystalline silicon or multi-crystalline silicon. The term "TEOS" means the silicon dioxide formed from the decomposition of tetraethyl orthosilicate ($Si(OC_2H_5)_4$). The term "alkylene" means a bivalent saturated aliphatic group or moiety regarded as derived from an alkene by opening of the double bond, such as ethylene: $—CH_2—CH_2—$ of methylene: $—CH_2—$, or from an alkane by removal of two hydrogen atoms from different carbon atoms. The term "alkyl" means an organic group with a general formula: $C_nH_{2n+1}$ where "n" is an integer and the "yl" ending means a fragment of an alkane formed by removing a hydrogen. The term "planar" means a substantially flat surface or flat topography having two dimensions of length and width. The terms "composition" and "slurry" are used interchangeably throughout the specification. The terms "a" and "an" refer to both the singular and the plural. KLEBOSOL™ particles (manufactured by AZ Electronic Materials, available from The DuPont Electronics, Inc.), such as KLEBOSOL™0 1598-B25 particles, are prepared by water glass process. All percentages are by weight, unless otherwise noted. All numerical ranges are inclusive and combinable in any order, except where it is logical that such numerical ranges are constrained to add up to 100%.

The method of polishing a substrate containing polysilicon of the present invention includes providing an acidic chemical mechanical polishing slurry consisting of water, abrasive particles, an organic acid, optionally a compound containing two quaternary ammonium groups and optionally a biocide; and providing an aqueous alkaline solution consisting of water, an amine compound having a formula:

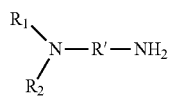

(I)

wherein $R_1$ and R2 are independently chosen from $C_1$-$C_4$ alkyl and R' is $C_1$-$C_4$ alkylene and optionally a biocide; and mixing the acidic chemical mechanical polishing slurry with the aqueous alkaline solution to form an alkaline chemical mechanical polishing slurry consisting of the water, the abrasive particles, the organic acid, the amine compound, optionally the biocides and optionally the compound containing two quaternary ammonium groups.

Preferably, in the method of chemical mechanical polishing a substrate comprising polysilicon, the water contained in the chemical mechanical polishing slurries and solutions provided is at least one of deionized and distilled to limit incidental impurities. Preferably, the abrasive used in the chemical mechanical polishing slurries is selected from the group consisting of inorganic oxides, inorganic hydroxides, inorganic hydroxide oxides, metal borides, metal carbides, metal nitrides and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. More preferably, the abrasive is a colloidal silica abrasive. Preferably, the colloidal silica abrasive contains at least one of fumed silica, precipitated silica and agglomerated silica. Preferably, the abrasive used in the chemical mechanical polishing composition of the present invention has an average particle size of ≤100 nm (more preferably, 1 to 100 nm). More preferably, the abrasive used in the chemical mechanical polishing composition of the present invention is a colloidal silica abrasive having an average particle size of ≤100 nm (preferably, 1 to 100 nm; more preferably, 10 to 80 am; still more preferably, 20 to 80 nm; most preferably, 60 to 30 nm) as measured by dynamic light scattering techniques (DLS).

Most preferably, in the method of polishing a substrate of the present invention, the colloidal silica abrasive particles are colloidal silica abrasive particles prepared by a water glass process. An example of commercially available colloidal silica abrasive particles made by a water glass process is KLEBOSOL™ 1598-B25 slurry (manufactured by AZ Electronics Materials, available from DuPont Electronics, Inc.). Such colloidal silica abrasives can be mixed with nitrogen-containing silane compounds. An example of such a mixture is KLEBOSOL™ 1598-B25 slurry (manufactured by AZ Electronics Materials, available from DuPont Electronics, Inc.) plus (0.01-0.02 wt % DEAMS to 1 wt % silica).

Optionally, but preferably, the aqueous acidic abrasive slurries include a compound containing two quaternary ammonium groups, such as N,N,N,N',N',N'-hexylbutyl-1,4-butanediammonium dihydroxide (HBBAH). Such compounds are included in the aqueous acidic slurries to enhance stabilization of the slurries during storage, shipment, and heat ageing while maintaining high polysilicon removal rates. These compounds are included in the aqueous acidic abrasive slurries in conventional amounts, preferably, 1-100 ppm, more preferably. 5-50 ppm POU.

Additional nitrogen-containing compounds that can be included in the chemical mechanical polishing compositions of the present invention are amino acids having from one to eight carbon atoms such as lysine, glutamine, glycine, iminodiacetic acid, alanine, valine, leucine, isoleucine, serine and threonine.

Preferably, the chemical mechanical polishing slurries contain no more than 6 wt % of abrasive particles, more preferably, from 0.01 to 5 wt %), further preferably, 0.05 to 3 wt %, even more preferably, 1 to 3 wt %, still more preferably, 1 to 2 wt %, abrasive particles.

The aqueous acidic slurries in the method of the present invention include one or more organic acids to provide a pH of less than 6, preferably, from 3-5, more preferably, from 4-5. Organic acids include, but are not limited to, dicarboxylic acids, wherein the dicarboxylic acids include, but is not limited to, oxalic acid, succinic acid, adipic acid, maleic acid, malic acid, glutaric acid, tartaric acid, salts thereof or mixtures thereof. More preferably the chemical mechanical polishing slurries contain a dicarboxylic acid, wherein the dicarboxylic acid is selected from the group consisting of oxalic acid, succinic acid, tartaric acid, salts thereof and mixtures thereof. Still more preferably, the dicarboxylic acid is selected from the group consisting of oxalic acid, succinic acid, salts thereof and mixtures thereof. Most preferably, the dicarboxylic acid is succinic acid or salts thereof.

The acidic chemical mechanical polishing slurries can contain 1 to 2,600 ppm, preferably. 100 to 1,400 ppm, more preferably, 100 to 1,350 ppm, even more preferably, 100 to 1,000 ppm, of an organic acid such as a dicarboxylic acid, wherein the dicarboxylic acid includes, but is not limited to, oxalic acid, succinic acid, adipic acid, maleic acid, malic acid, glutaric acid, tartaric acid, salts thereof or mixtures thereof.

The amine compounds included in the chempack or the aqueous alkaline solution are in amounts of 10-10,000 ppm, preferably, from 50-5000 ppm, more preferably, from 100-5000 ppm, most preferably, 100-2500 ppm.

Preferably, the amine compounds are selected from the group consisting of 3-(diethylamino)propylamine, N,N-dimethylethylenediamine, N,N-diethylenediamine, N,N-di-n-butylethylenediamine, 3-(dimethylamino)-1-propylamine, N-isopropyl-1,3-dipropanediamine, 2-dimethylamino-2-propylamine and mixtures thereof. More preferably, the amine compounds are selected from the group consisting of 3-(diethylamino)propylamine, N,N-dimethylethylenediamine, and mixtures thereof. Most preferably, the amine compound is 3-(diethylamino)propylamine.

In the method of polishing a substrate comprising polysilicon of the present invention, the aqueous alkaline solution containing the amines has a pH of greater than 7. Preferably, the aqueous alkaline solution has a pH of greater than 7-13. More preferably, the aqueous alkaline solution has a pH of 8-12. Even more preferably, the aqueous alkaline solution has a pH of 10-12; and, most preferably, a pH of 10-11.5, such as from 10.5-11.5 being the very most preferred range.

Optionally, the chemical mechanical polishing slurries and solutions can contain biocides, such as KORDIX™ MLX (9.5 -9.9 wt % methyl-4-isothiazolin-3-one, 89.1-89.5 wt % water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of DuPont Electronics, Inc.). Such biocides can be included in the chemical mechanical polishing slurries and solutions of the present invention in conventional amounts, as known to those of ordinary skill in the art.

The aqueous acidic shirty and the aqueous alkaline solution can be mixed together by any conventional method known in the art to form an aqueous alkaline chemical mechanical polishing slurry. Typically, magnetic mixers with adjustable speeds can be used to mix the acidic slurry and the alkaline solution. Mixing is done at room temperature. The acidic slurry and the alkaline solution are mixed in weight ratios of 1:100 to 100:1, preferably, 1:7 to 7:1, more preferably, 1:3 to 3:1, most preferably, 1:1. Mixing can be done on the polisher platen or before application of the acidic slurry and alkaline solution to the polisher platen.

The mixed acidic slurry and chempack or aqueous alkaline solution form an aqueous alkaline chemical mechanical polishing slurry with a pH of greater than 7. The mixing of the acidic slurry with the chempack raises the mixture to an alkaline pH due to the low chain alkyl amines. The relatively rapid rise in pH of the acidic slurry during the mixing process prevents agglomeration of the abrasive particles.

Preferably, the aqueous alkaline chemical mechanical polishing slurry has a pH of greater than 7-13, more preferably, the aqueous alkaline chemical mechanical polishing slurry has a pH of 8-12, even more preferably, the aqueous alkaline chemical mechanical polishing slurry has a pH of 10-12; and, most preferably, a pH of 10-11.5, such as from 10.5-11.5 being the very most preferred range.

Preferably, the aqueous alkaline chemical mechanical polishing slurry of the present invention consists of the water, the abrasive particles, the organic acid, the amine compound having a formula:

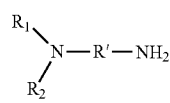

wherein $R_1$ and $R_2$ are independently chosen from $C_1$-$C_4$ alkyl and R' is $C_1$-$C_4$ alkylene, optionally a compound containing two quaternary ammonium groups and optionally a biocide, wherein a pH of the aqueous alkaline chemical mechanical polishing slurry is greater than 10.

Preferably the amine compounds in the aqueous alkaline chemical mechanical polishing slurry of the present invention are selected from the group consisting of 3-(diethylamino)propylamine, N,N-dimethylethylenediamine, N,N-diethylenediamine, N,N-di-n-butylethylenediamine, 3-(dimethylamino)-1-propylamine, N-isopropyl-1,3-dipropanediamine, 2-dimethylamino-2-propylamine and mixtures thereof. More preferably, the amine compounds are selected from the group consisting of 3-(diethylamino)propylamine, N,N-dimethylethylenediamine, and mixtures thereof. Most preferably, the amine compound in the aqueous alkaline chemical mechanical polishing slurry of the present invention is 3-(diethylamino)propylamine.

Preferably, the aqueous alkaline chemical mechanical polishing slurries contain no more than 6 wt % of abrasive particles, more preferably, from 0.01-5 wt %, further preferably, 0.05-3 wt %, even more preferably, 1-3 wt %, still more preferably, 1-2 wt %, abrasive particles.

The aqueous alkaline chemical mechanical polishing slurries can contain 1-2,600 ppm, preferably, 100-1,400 ppm, more preferably, 100-1,350 ppm, even more preferably, 100-1,000 ppm, of the organic acid. Preferably, the organic acid is a dicarboxylic acid.

The amines are included in the aqueous alkaline chemical mechanical polishing slurry in amounts of 25-10,000 ppm, preferably, from 50-10000 ppm, more preferably, from 50-5000 ppm, most preferably, 100-2500 ppm.

Optionally, but preferably, the aqueous alkaline chemical mechanical polishing slurry of the present invention includes a compound containing two quaternary- ammonium groups as described.

The biocides described above can be included in the aqueous alkaline chemical mechanical slurries of the present invention in conventional amounts well known to those of skill in the art.

More preferably, the aqueous alkaline chemical mechanical polishing slurry of the present invention consists of the water, 1-3 wt % abrasive particles, 100-1,350 ppm dicarboxylic acid, 50-5000 ppm amine compound having a formula:

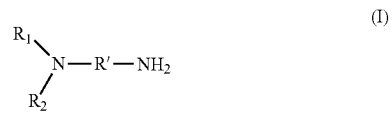

wherein $P_1$ and $R_2$ are independently chosen from $C_1$-$C_4$ alkyl and R' is $C_1$-$C_4$ alkylene, optionally a compound containing two quaternary ammonium groups and optionally a biocide, wherein a pH of the aqueous alkaline chemical mechanical polishing slurry is greater than 10 to 11.5.

Even more preferably, the aqueous alkaline chemical mechanical polishing slurry of the present invention consists of the water, 1-2 wt % abrasive particles, 100-1000 ppm dicarboxylic acid, 100-2500 ppm amine compound selected from the group consisting of 3-(diethylamino)propylamine, N,N-dimethylethylenediamine, N,N-diethylenediamine, N,N-di-n-butylethylenediamine, 3-(dimethyamino)-1-propylamine, N-isopropyl-1,3-dipropanediamine, 2-dimethylamino-2-propylamine and mixtures thereof. More preferably, the amine compounds are selected from the group consisting of 3-(diethylamino)propylamine, N,N-dimethylethylenediamine, and mixtures thereof, optionally a compound containing two quaternary ammonium groups and optionally a biocide, wherein a pH of the aqueous alkaline chemical mechanical polishing slurry is from 10.5-11.5.

Preferably, the substrate provided is a semiconductor substrate comprising polysilicon and a dielectric such as TEOS or SiN, more preferably, the substrate is a semiconductor comprising polysilicon and TEOS.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69-34.5 kPa normal to a surface of the substrate being polished.

In the method of polishing a substrate comprising polysilicon of the present invention, the chemical mechanical polishing composition provided has a polysilicon removal rate ≥500 Å/min.; preferably, a polysilicon removal rate ≥700 Å/min; more preferably, ≥1,000 Å/min; further preferably, ≥1200 Å/min.; and even more preferably, >2000

Å/min with a platen speed of 93-123 revolutions per minute, a carrier speed of 87-117 revolutions per minute, a chemical mechanical polishing composition flow rate of 40-300 mL/min, a nominal down force of 21.4-24.1 kPa on a 300 mm polishing machine; and, wherein the chemical mechanical polishing pad comprises a polyurethane polishing layer containing polymeric hollow core microparticles and a polyurethane impregnated non-woven subpad.

The following examples are intended to illustrate the present invention, but are not intended to limit the scope of the invention.

Example 1

Slurry Formulations

The aqueous acid chemical mechanical polishing slurries of this Example were prepared by mixing an abrasive of KLEBOSOL™0 1598-B25 or KLEBOSOL™ 1598-B25 plus (0.01-0.02 wt %) DEAMS to 1 wt % silica) with water at room temperature. Mixing was done with a conventional laboratory magnetic mixer. The pH was adjusted with either succinic acid or nitric acid.

TABLE 1

| Slurry | KLEBOSOL™ 1598-B25 | DEAMS | Diquat[1] | Final pH | pH Titrant |
|---|---|---|---|---|---|
| S1 | 2 wt % | 0.01 wt % | 0 | 4.5 | Succinic acid |
| S2 | 4 wt % | 0.02 wt % | 0 | 4.5 | Nitric acid |
| S3 | 4 wt % | 0.02 wt % | 0 | 4.5 | Succinic acid |
| S4 | 4 wt % | 0 | 0 | 3.5 | Nitric acid |
| S5 | 4 wt % | 0 | 300 ppm | 3.5 | Nitric acid |

[1]N,N,N,N',N',N'-hexylbutyl-1,4-butanediammonium dihydroxide (HBBAH).

Example 2

Chemical Mechanical Polishing Slurries of the Present Invention

Chemical mechanical polishing compositions of the present invention were prepared as shown in the table below. Amines were mixed with the slurries of Example 1 above. The components were mixed at room temperature.

TABLE 2

| Polishing Slurry | Acid Slurry Solution | 3-(Diethylamino)propyl Amine | N,N-Dimethylethylene diamine | Final pH |
|---|---|---|---|---|
| PS1 | 1 wt % (S1) | 1,250 ppm | 0 | 10.63 |
| PS2 | 2 wt % (S2) | 1,250 ppm | 0 | 10.39 |
| PS3 | 2 wt % (S3) | 1,250 ppm | 0 | 10.17 |
| PS4 | 2 wt % (S4) | 1,250 ppm | 0 | 10.56 |
| PS5 | 2 wt % (S5) | 1,250 ppm | 0 | 10.46 |
| PS6 | 2 wt % (S3) | 0 | 1,250 ppm | 9.66 |
| PS7 | 2 wt % (S3) | 2,500 ppm | 0 | 10.66 |

Example 3

Comparative Chemical Mechanical Polishing Slurries

Comparative chemical mechanical polishing compositions were prepared as shown in the table below. Amines were mixed with the slurries of Example 1 above. The components were mixed at room temperature.

TABLE 3

| Polishing Slurry | Acid Slurry Solution | Amine | Final pH |
|---|---|---|---|
| CS1 | 1 wt % (S1) | 0 | 4.73 |
| CS2 | 2 wt % (S2) | 0 | 4.86 |
| CS3 | 2 wt % (S3) | 0 | 4.54 |
| CS4 | 2 wt % (S4) | 0 | 3.67 |
| CS5 | 2 wt % (S5) | 0 | 3.79 |
| CS6 | 2 wt % (S3) | 1,250 ppm TEAR | 9.54 |
| CS7 | 2 wt % (S3) | 1,250 ppm EDA | 10.2 |
| CS8 | 2 wt % (S3) | 1,250 ppm PEI | 7.65 |
| CS9 | 2 wt % (S3) | 1,250 ppm pentaethylene-hexamine | 9.46 |
| CS10 | 2 wt % (S3) | 1,250 ppm 1,3-diaminopropane | 10.55 |
| CS11 | 2 wt % (S3) | 1,250 ppm EA | 10.04 |

Example 4

Polysilicon and TEOS Removal Rates

The polishing experiments for the polishing slurries of Tables 2 and 3 above were performed on 20.32cm (8 inch) square blanket wafers installed on a Strasbaugh 6EC polishing machine, The polishing removal rate experiments were performed on 20.32 cm square blanket 15 kÅ-thick TEOS sheet wafers from Novellus and polysilicon blanket wafers available from WaferNet Inc., Silicon Valley Microelectronics or SKW Associates, Inc. All polishing experiments were performed using an IC1010 polyurethane polishing pad paired with an SP2310 subpad (commercially available from Rohm and Haas Electronic Materials CMP Inc) with a typical down force of 21.4 kPa (3.1 psi), a chemical mechanical polishing composition flow rate of 150 mL/min, a table rotation speed of 93 rpm and a carrier rotation speed of 87 rpm. A Kinik PA33A-3 diamond pad conditioner (commercially available from Kinik Company) was used to dress the polishing pad. The polishing pad was broken in with the conditioner using a down force of 9 lbs (4.1 kg) for 15 minutes and 7 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The poly silicon and TEOS removal rates were determined using a KLA ASET F5X metrology tool.

TABLE 4

| Slurry | Poly-Si Removal Rate (Å/min) | TEOS Removal Rate (Å/min) |
|---|---|---|
| PS1 | 6134 | 3 |
| PS2 | 6761 | 5 |
| PS3 | 7190 | 6 |
| PS4 | 6179 | 2 |
| PS5 | 5922 | 9 |
| PS6 | 6668 | 4 |
| PS7 | 8676 | 2 |
| CS1 | 1638 | 1274 |
| CS2 | 1982 | 1432 |
| CS3 | 1898 | 1886 |
| CS4 | 1416 | 88 |
| CS5 | 1482 | 1243 |
| CS6 | 5879 | 5 |
| CS7 | 5761 | 34 |
| CS8 | 12.24 | 1 |
| CS9 | 6882 | 6 |

TABLE 4-continued

| Slurry | Poly-Si Removal Rate (Å/min) | TEOS Removal Rate (Å/min) |
|---|---|---|
| CS10 | 7278 | 4 |
| CS11 | 5104 | 8 |

Example 5

Polysilicon Static Etch Rate

Aqueous etch solutions are in Table 5 below. The aqueous solutions contained 2500 ppm of an amine without any pH adjustment. CES1 included only water and sufficient amount of succinic acid to maintain a pH=4.44. The static corrosion tests were carried out by immersing polysilicon blanket wafers (20 cm in diameter) in 2000 g samples. The polysilicon wafers were removed from the tested solutions after 30 min, The pre- and post-etching thickness of the polysilicon films were measured using KLA Spectral FX200 metrology tool. The total removal amount was determined by subtracting post-etching thickness from pre-etching thickness (as measured at 49 points on the wafers). The static etching rate (Å/min) was then calculated by total removal (Å/130 min). The standard deviation was calculated from the 49 point values of the etch rate across the wafers reflecting the uniformity of the etching.

TABLE 5

| Solution | Amine | pH | Average Static Etch Rate (Å/min) | Standard Deviation (Å/min) |
|---|---|---|---|---|
| CES1 | — | 4.44 | 4 | 1.1 |
| CES2 | 1,3-diaminopropane | 11.16 | 219 | 69.9 |
| ES1 | 3-(diethylamino)-propylamine | 11.09 | 25 | 0.7 |
| CES3 | Tetraethylene-pentamine | 10.65 | 55 | 50.0 |
| CES4 | Ethanolamine | 10.68 | 93 | 7.4 |
| CES5 | TEAH | 11.9 | 74 | 29.8 |

ES1 and CES1 had the best results where the wafers appeared smooth and clear without any observable roughening of the surface. In contrast, CES2 and CES3 had substantial observable roughening on their surfaces. CES4 had some observable surface roughening and the surface of CES5 appeared poor with significant roughening.

Example 6

Polysilicon Static Etch Rate of N,N-dimethylethylenediamine and Ethylenediamine

The aqueous solutions contained 2500 ppm N,N-dimethylethylenediamine or ethylenediamine. The solutions were left as is without any pH adjustment.

The static corrosion tests were carried out by immersing polysilicon blanket wafers (20 cm in diameter) in 2000 g samples. The polysilicon wafers were removed from tested solutions after 30 min. The total removal amount was determined by subtracting post-etching thickness from pre-etching thickness (as measured at 49 points on the wafers). The static etching rate (Å/min) was then calculated by total removal (Å/130 min). The standard deviation was calculated from the 49 point values of the etch rate across the wafers reflecting the uniformity of the etching.

TABLE 6

| Solution | Amine | pH | Average Static Etch Rate (Å/min) | Standard Deviation (Å/min) |
|---|---|---|---|---|
| ES2 | NN-dimethylethylenediamine | 10.83 | 17 | 12.3 |
| CES6 | Ethylenediamine | 11.06 | 167 | 95 |

ES2 showed substantial reduction in static etch rate of polysilicon in contrast to CES6.

What is claimed is:
1. A method of chemical mechanical polishing polysilicon, comprising:
providing a substrate comprising polysilicon;
providing an acid chemical mechanical polishing slurry consisting of:
water;
abrasive particles;
an organic acid;
optionally a compound containing two quaternary ammonium groups;
optionally a biocide; and
providing an alkaline solution consisting of:
water;
an amine compound having a formula:

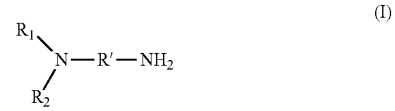

(I)

wherein $R_1$ and $R_2$ are independently chosen from $C_1$-$C_4$ alkyl and R' is $C_1$-$C_4$ alkylene;
optionally a biocide; and
mixing the acid chemical mechanical polishing slurry with the alkaline solution to form an alkaline chemical mechanical polishing slurry consisting of the water, the abrasive particles, the organic acid, the amine compound and optionally the biocide; optionally the compound containing two quaternary ammonium groups; and
providing a chemical mechanical polishing pad, having a polishing surface;
creating dynamic contact at an interface between the chemical mechanical polishing pad and the substrate; and
dispensing the alkaline chemical mechanical polishing slurry onto the polishing surface of the chemical mechanical polishing pad at or near the interface between the chemical mechanical polishing pad and the substrate to remove at least some of the polysilicon.

2. The method of claim 1, wherein the abrasive particles are selected from the group consisting of inorganic oxides, inorganic hydroxides, inorganic hydroxide oxides, metal borides, metal carbides, metal nitrides and mixtures thereof.

3. The method of claim 1, wherein the amine is selected from the group consisting of 3-(diethylamino)propylamine, N,N-dimethylethylenediamine, N,N-diethylenediamine, N,N-di-n-butylethylenediamine, 3-(dimethylamino)-1-propylamine, N-isopropyl-1,3-dipropanediamine, 2-dimethyl-amino-2-propylamine and mixtures thereof.

4. The method of claim 1, wherein the organic acid is a dicarboxylic acid.

5. The method of claim 4, wherein the dicarboxylic acid is selected from the group consisting of oxalic acid, succinic acid, adipic acid, maleic acid, malic acid, glutaric acid, tartaric acid, salts thereof and mixtures thereof.

6. The method of claim 1, wherein a pH of the acidic slurry is less than 6.

7. The method of claim 1, wherein a pH of the alkaline slurry is greater than 7.

8. The method of claim 1, wherein the second alkaline chemical mechanical polishing slurry has a polysilicon removal rate of ≥500 Å/min with a platen speed of 93-123 revolutions per minute, a carrier speed of 87-117 revolutions per minute, a chemical mechanical polishing slurry flow rate of 125-300 ml/min, a nominal down force of 21.4-24.1 kPa on a 200 mm polishing machine; and, wherein the chemical mechanical polishing pad comprises a polyurethane polishing layer containing polymeric hollow core microparticles and a polyurethane impregnated non-woven subpad.

* * * * *